United States Patent [19]

Liu

[11] Patent Number: 5,534,455
[45] Date of Patent: *Jul. 9, 1996

[54] METHOD FOR PROTECTING A STACKED GATE EDGE IN A SEMICONDUCTOR DEVICE FROM SELF ALIGNED SOURCE (SAS) ETCH

[75] Inventor: David K. Y. Liu, Cupertino, Calif.

[73] Assignee: Advanced Micro Devices, Inc., Sunnyvale, Calif.

[*] Notice: The term of this patent shall not extend beyond the expiration date of Pat. No. 5,470,773.

[21] Appl. No.: 433,267

[22] Filed: May 2, 1995

Related U.S. Application Data

[63] Continuation-in-part of Ser. No. 233,174, Apr. 25, 1994, Pat. No. 5,470,773.

[51] Int. Cl.$^6$ ............................................... H01L 21/8247
[52] U.S. Cl. .................................... 437/43; 437/44
[58] Field of Search ........................... 437/38, 43, 44, 437/158, 984; 148/DIG. 141

[56] References Cited

U.S. PATENT DOCUMENTS

| | | | |
|---|---|---|---|
| 5,019,527 | 5/1991 | Ohshima et al. | 437/44 |
| 5,120,671 | 6/1992 | Tang et al. | 437/43 |
| 5,149,665 | 9/1992 | Lee | 437/43 |

FOREIGN PATENT DOCUMENTS 5-343693  12/1993  Japan .

*Primary Examiner*—Chandra Chaudhari
*Attorney, Agent, or Firm*—Benman Collins & Sawyer

[57] ABSTRACT

A process for protecting the stacked gate edge of a semiconductor device is disclosed. The process provides for providing a spacer formation before the self aligned source (SAS) etch is accomplished. By providing the spacer formation prior to the SAS etch, tunnel oxide integrity is much improved and the source junction implant profile is much more uniform because the silicon around the source region is not gouged away.

7 Claims, 11 Drawing Sheets

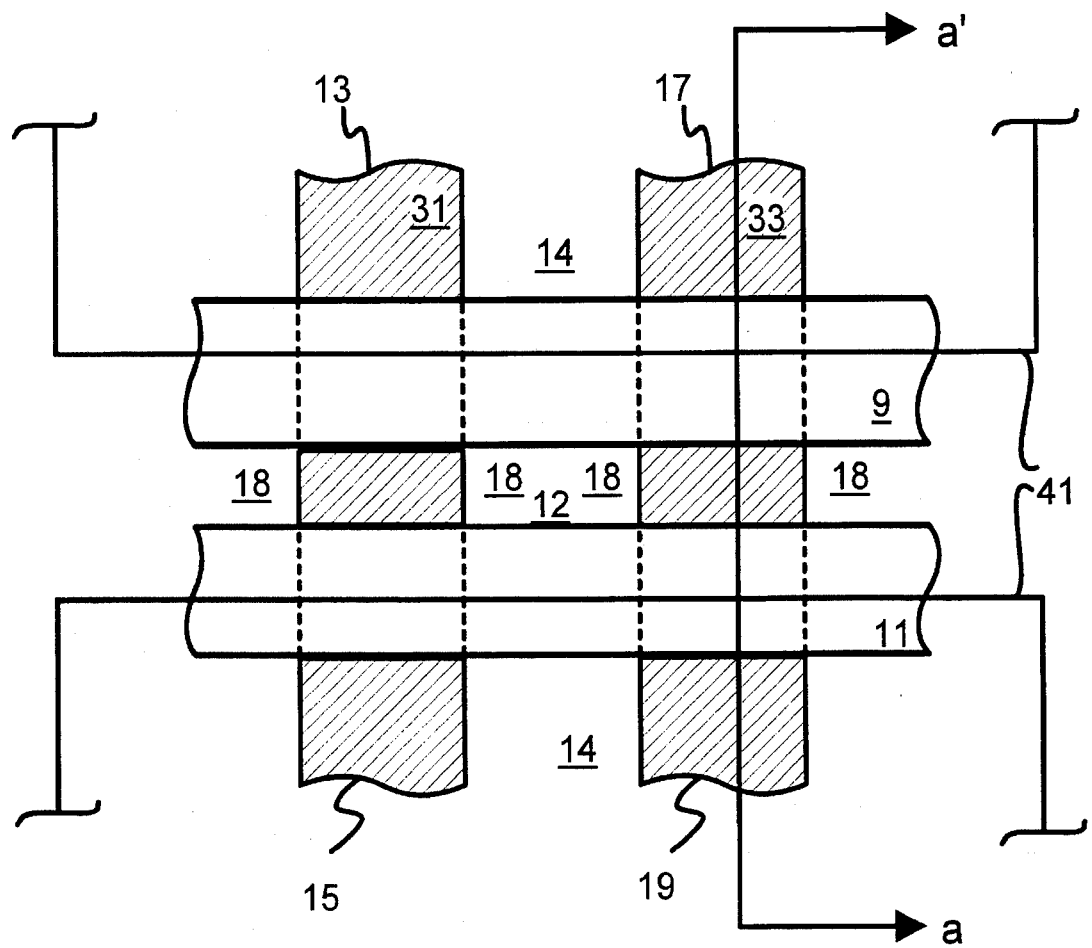
PRIOR ART     Fig. 1

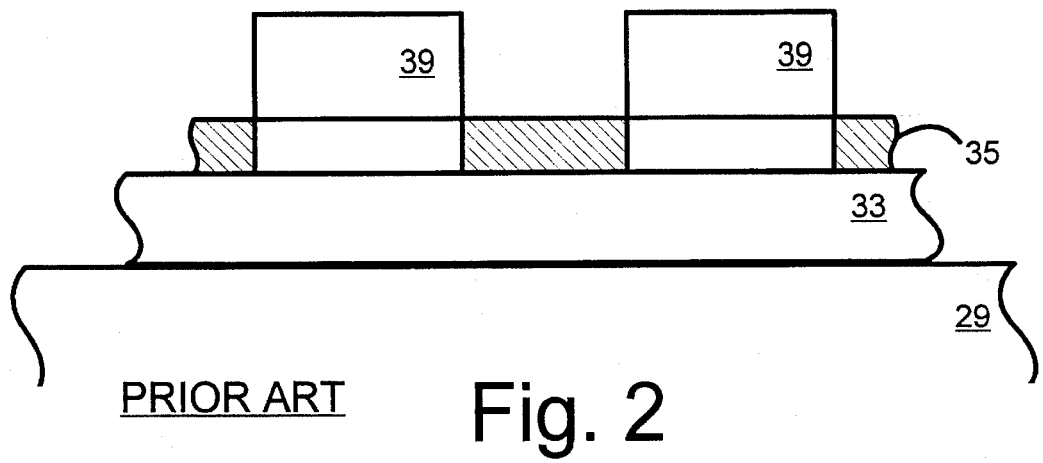
PRIOR ART Fig. 2
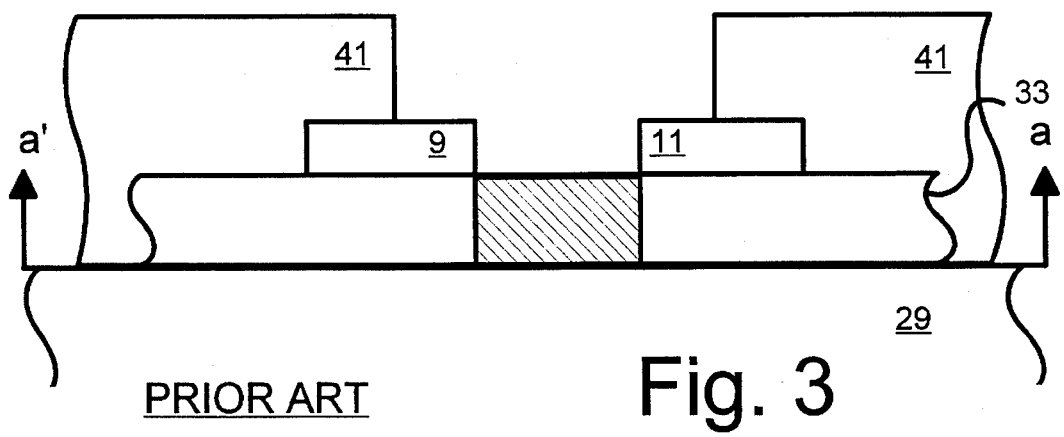
PRIOR ART Fig. 3
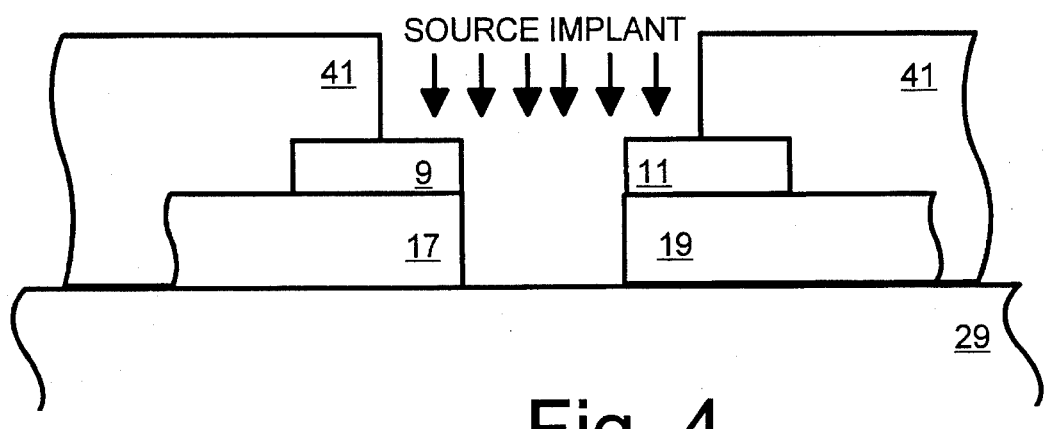
PRIOR ART Fig. 4

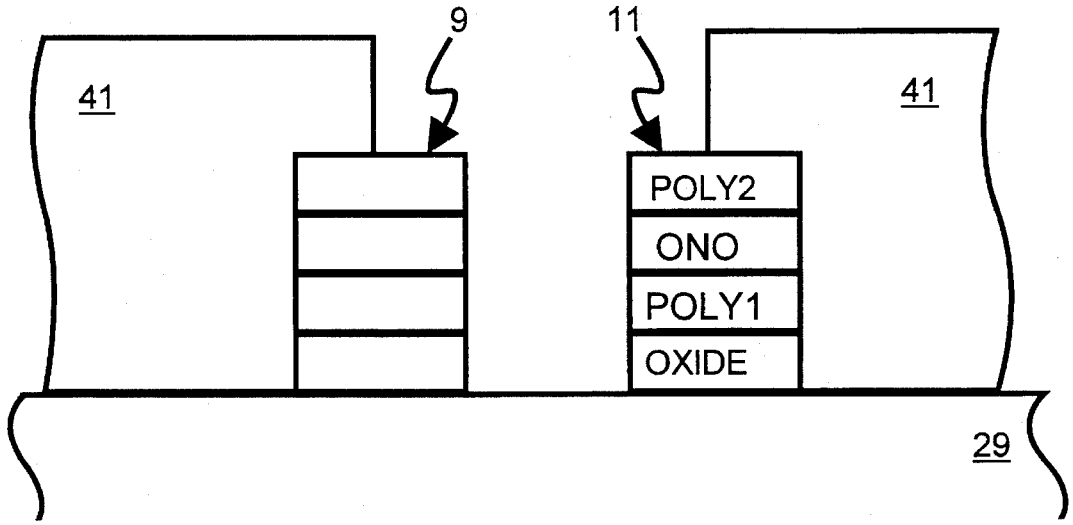
PRIOR ART  Fig. 4A
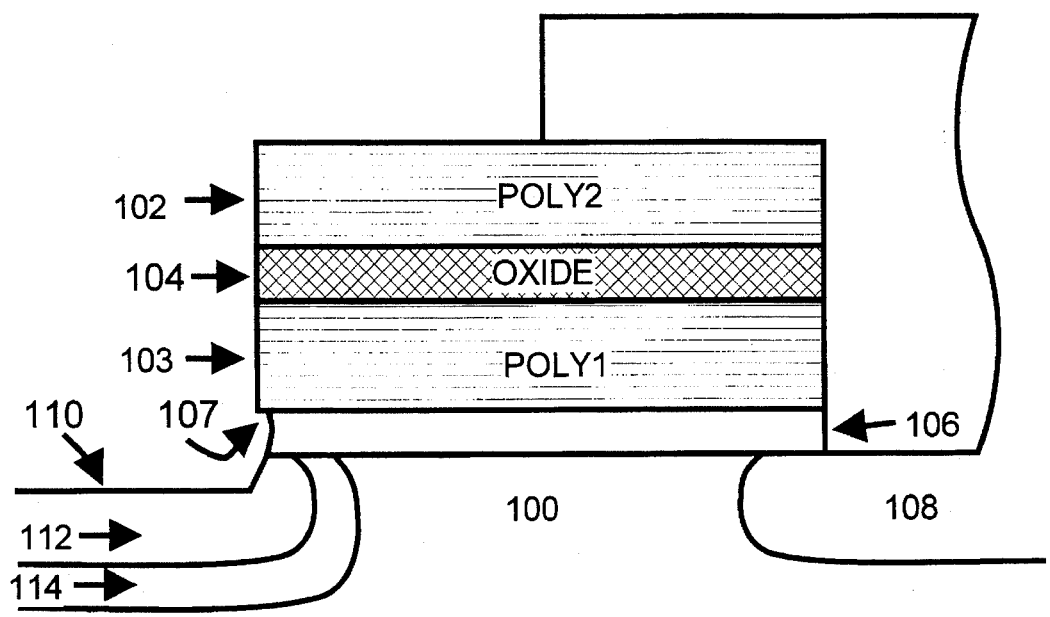
PRIOR ART  Fig. 5

METHOD FOR PROTECTING A STACKED GATE EDGE IN A SEMICONDUCTOR DEVICE FROM SELF ALIGNED SOURCE (SAS) ETCH

This application is a continuation-in-part of application Ser. No. 08/233,174, now U.S. Pat. No. 5,470,773, filed on Apr. 25, 1994.

FIELD OF THE INVENTION

The present invention relates to semiconductor processing techniques and more particularly to self-aligned source (SAS) processing techniques.

BACKGROUND OF THE INVENTION

In producing semiconductors and more particularly FLASH EPROM devices, increasing the density of the device significantly enhances performance as well as cost effectiveness of the device. The typical way increasing the density has been accomplished is through the use of a so-called self aligned source (SAS) etching technique which provides for the proper formation of the FLASH cell. An example of this type of technique is disclosed in U.S. Pat. No. 5,120,671 entitled "PROCESS FOR SELF ALIGNING A SOURCE REGION WITH A FIELD OXIDE REGION AND A POLYSILICON GATE".

The above-identified patent discloses a method for forming a source region which is self-aligned with the poly word line as well as an apparatus formed thereby. In the patent, the end edges of the field oxide regions are vertically aligned with the poly word line with no bird's beak encroachment and corner rounding effect remaining in what will become the source region. The source region, formed between the ends of the field oxide regions of neighboring cells, is thus self-aligned with both the field oxide regions and the poly gate word lines. This self-alignment of the source region allows closer placement of poly word lines without any decrease in source width which thus requires less physical separation between (i.e., allows closer placement of) one memory cell to the next memory cell. Reduced cell size and greater overall device density is thus achieved.

In this example, the SAS etch is used after a stacked gate etch as a way to reduce overall cell size in a FLASH EPROM process. However, during the SAS etch, the stacked gate edge is exposed to the SAS etch, which has a significant negative impact on the tunnel oxide integrity. In addition, the building implants which consist mainly of the source diffusion implant are done after the SAS etch. Since the SAS etch has a tendency to etch away or gouge away silicon under the source region, the implant profiles might not be uniform at the source and may change the profile of the surface source that overlaps below the stacked gate. In that case, the erase integrity and erase distribution of the FLASH cell may be significantly degraded. As is well known, if the overlap area is too great, source coupling may be higher than and interfere with the erase operation. If the overlap area is too small, there may not be enough area for erasure. Typically due to the severity of SAS over-etch, erase is significantly impeded due to the lack of sufficient dose underneath the source overlap region.

Accordingly, what is needed is a system for ensuring that the overall cell size of semiconductor is reduced which doesn't have a negative impact on the tunnel oxide integrity of the device. In addition, the system should be one in which the implant profiles are uniform at the source overlap region, thereby ensuring cell integrity.

The present invention addresses these needs.

SUMMARY OF THE INVENTION

The present invention discloses a method and system for protecting a stacked gate edge of a semiconductor device. The method comprises the step of providing the stacked gate edge on the semiconductor device, performing the source implant dose to ensure uniform profile prior to SAS etch, providing an oxide or polysilicon spacer formation on the stacked gate edge prior to self-aligned source etch, providing a self aligned source etch of the semiconductor device, and providing a voltage source connection implant. In so doing, the stacked gate edge is protected thereby providing for tunnel oxide integrity and also a uniform source junction profile which is performed before the SAS etch and which is also independent of gouge and damage more than those provided by previously known processes. Further, the step of providing the source connection implant after the SAS etch eliminates several steps, including an oxidation step and masking step. The reduction in processing steps helps reduce processing time and cost.

The present invention has particular application in a FLASH EPROM cell technology. With the present invention, the increased cell density associated with the FLASH cell is maintained, while the above-mentioned problems with tunnel oxide integrity and source junction profile are eliminated.

BRIEF DESCRIPTION OF THE DRAWINGS

FIG. 1 is a top view of a portion of a memory device.

FIGS. 2–4 are side views of the memory device of FIG. 1.

FIG. 4a is a sectional view of the memory device of FIG. 1.

FIG. 5 is a cutaway perspective view of the source side view of a conventional FLASH cell after the SAS etch showing the source profile provided if source implant is after self aligned source (SAS) etch in the prior art. Note that, since the implants are performed after the SAS etch, their profiles are extremely sensitive to silicon gouge and damage, thus erase behavior is very inadequate.

DETAILED DESCRIPTION

Figure 6:
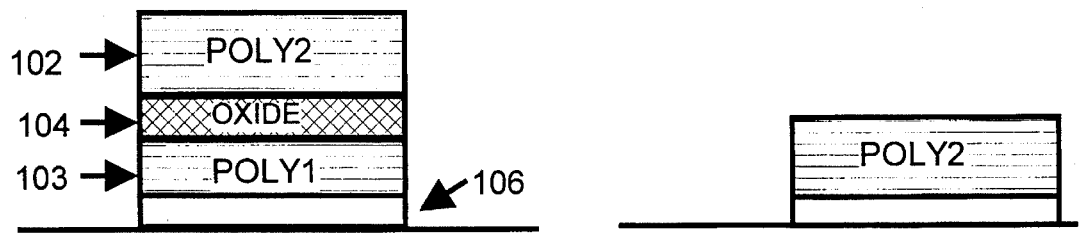
FIGS. 6–10 are cutaway perspective views of a FLASH cell as it proceeds through a conventional (prior art) process. Both flash memory cell and the supporting peripheral transistors are shown.
Figure 7:
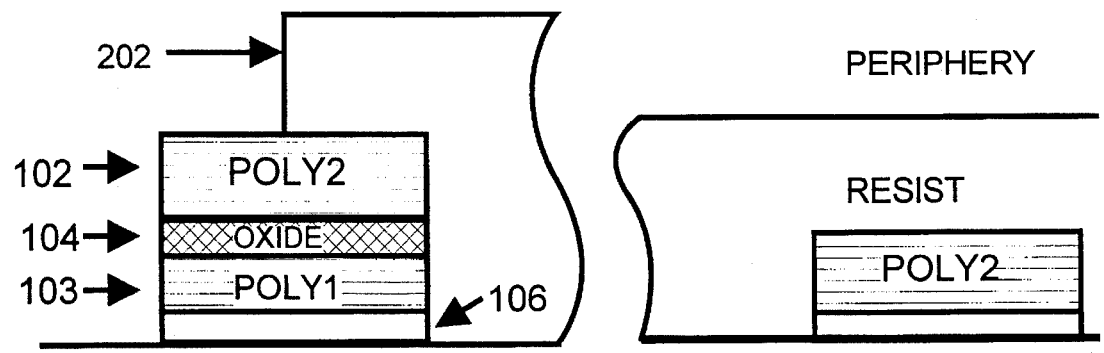
Figure 8:
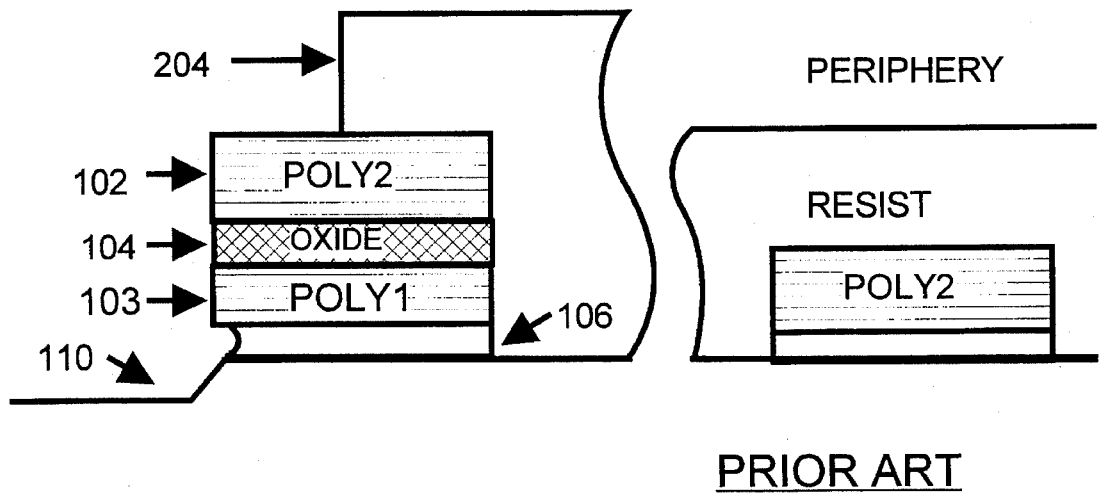

The present invention is related to an improvement in the processing of a semiconductor circuit, particularly a FLASH EPROM cell. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

With reference to the drawings, FIG. 1 illustrates a top view of a portion of a memory device formed in accordance with a conventional process. In this process, field oxide regions 31 and 33 are formed by growing oxide between parallel rows of nitride regions 18 to form the field oxide regions 31 and 33 as continuous lines across the source line 12 formed in the openings of a latticework of nitride regions 18. A layer of polysilicon is then deposited over the field oxide regions 31 and 33. After placing a photoresist mask over the polysilicon, the portions of the polysilicon left exposed are etched away. The remaining portions of polysilicon are poly word lines 9 and 11, which run parallel to source line 12.

Etching the polysilicon to form poly word lines 9 and 11 exposes the underlying field oxide regions 31 and 33 in the region of source line 12. Source mask 41 is then placed over the memory device and the oxide regions 31 and 33 are then etched away where they were exposed by the etching of poly word lines 9 and 11. This field oxide etch, which uses a high selectivity etch, as is discussed in more detail below, reduces field oxide regions 31 and 33 into separate field oxide regions 13, 15, 17 and 19. More importantly, this field oxide etch aligns field oxide regions 13 and 15, as well as 17 and 19, with the edges of poly word lines 9 and 11. Thus, when source implantation occurs it is self-aligned to the coincident edges of the field oxide and the polysilicon regions.

It is important to note that the source mask 41 is not used to align the source region implantation with the edges of the poly word lines. The source mask 41 is placed on the memory device to protect (during implantation) the portions of the field oxide regions 31 and 33 which reside on the other side of the poly word lines 9 and 11 from the source region 12 and between which the drain regions 14 will later be formed.

The formation and resulting alignment of field oxide regions 17 and 19 with poly word lines 9 and 11 is further shown in side views in FIGS. 2–4. Referring now to FIG. 2, field oxide 33 is formed on the silicon substrate 29. Polysilicon 35 is then deposited on the field oxide 33. A photoresist mask 39 is then placed on top of the polysilicon 35 leaving select portions of the polysilicon exposed. Note that a direct write technique, using for example an electron beam or a laser beam, could also be used to create the mask pattern in the photoresist.

Etching the exposed polysilicon 35 through the photoresist mask 39 of FIG. 2 yields the formation, as shown in FIG. 3, where the only remaining polysilicon is that which was protected by the opaque portions of photoresist mask 39. The remaining polysilicon portions are poly word lines 9 and 11. Note that FIG. 2 represents a cross-sectional view of FIG. 1 along line a—a and shows the continuous field oxide layer 33 underlying poly word lines 9 and 11.

Forming poly word lines 9 and 11, by etching the exposed polysilicon through the mask 39, exposes portions of the underlying field oxide 33. In the preferred embodiment, mask 41 is then placed on the device to protect the drain regions and then the field oxide portions are etched away using a high selectivity oxide etch, as is discussed more fully below. Referring now to FIG. 4, after etching field oxide 33, the portions that remain are field oxide regions 17 and 19.

Referring to FIG. 4A, what is shown is the cross section of the active cell region at the same point in the process before the source implant. The source implant is then performed along with a drain implant.

Referring now to FIG. 5, what is shown is an enlarged cutaway diagram of a FLASH EPROM cell 100 which has been processed in accordance with the prior art and the subsequent source and drain implant. Note that FIG. 5 can be thought of as the right half of FIG. 4A with source and drain implants performed after the SAS oxide etch. This cell 100 comprises first and second polysilicon layers 102 and 103 and oxide region 104 therebetween, and a tunnel oxide region 106 between the first poly silicon layer 102 and the silicon area 108. In such a cell, the SAS etch 110 could effect the tunnel oxide region 106 with damage induced by the etch as shown by 107 and also could cause gouging of the silicon area which would cause a large variation on the implant regions and on the lateral profile of the oxide region 106 under the gate. To more specifically describe how this might occur, refer now to FIGS. 6 through 10, which show the various stages of the operation of the prior art process.

Figure 9:
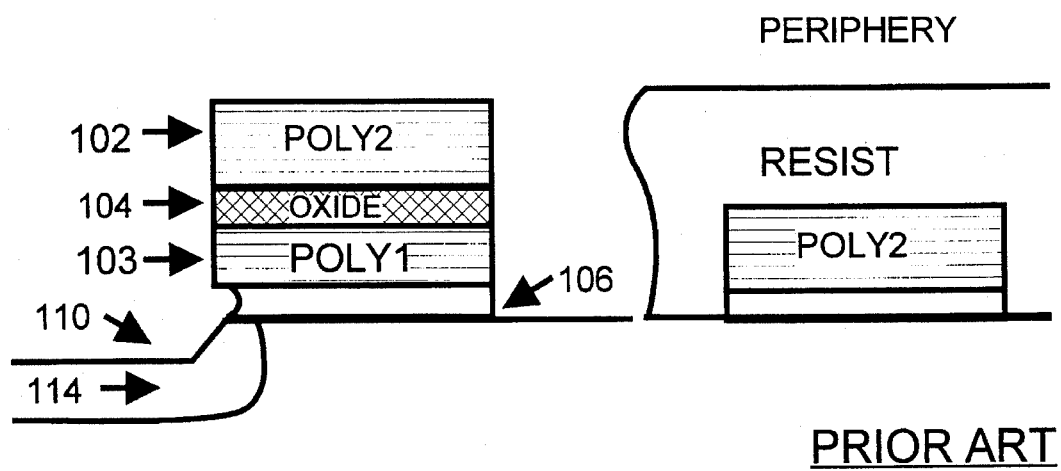
Figures 10, 12, 12A, 12B:
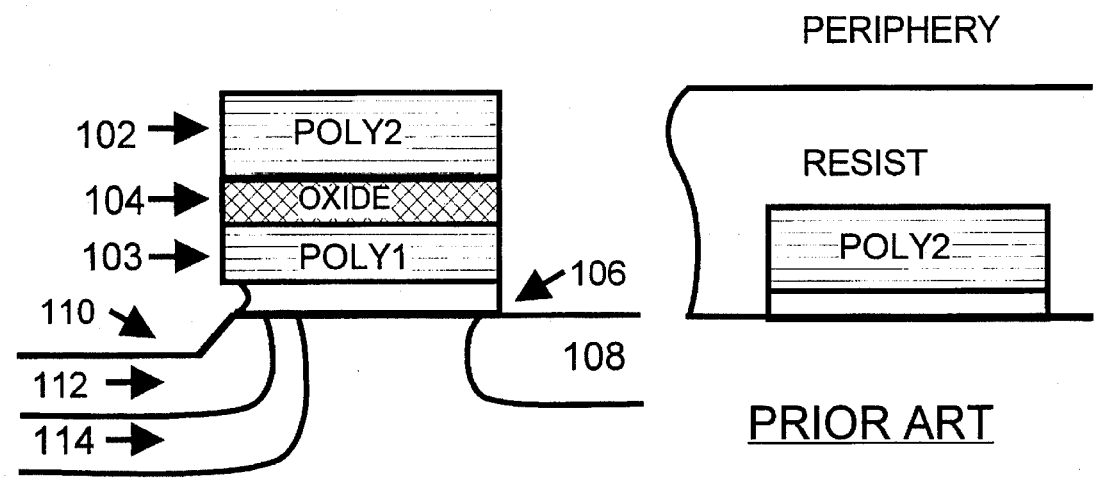
FIG. 12 (split up into 12A and 12B) is a detailed flow chart of the process of FIG. 11.

Referring to FIG. 6, initially a stacked gate etch is applied to the polysilicon region 102. Then, thereafter, referring to FIG. 7, an SAS mask 202 is placed on top of the device to allow for certain portions of the oxide to be masked. Thereafter there is an SAS etch 204 which essentially removes a portion of the silicon area shown in FIG. 8. In FIG. 9, a first implant 114 is provided typically to reduce the unwanted band-band tunneling current, and a resist strip is applied. As is seen this implant could be brought to a position well inside the gate area of the device. This implant is optional. The second implant is provided to provide the source/drain regions 112/108 shown in FIG. 10. It is this implant and its resultant high surface concentration under the source overlap region that facilitates the proper erasure of the flash code. As is seen in FIG. 10, the resultant cell could have significant tunnel oxide erosion as well as degraded silicon doping due to silicon gouge from the SAS etch process. A conventional process to fabricate the peripheral transistor then follows to finish off the process.

The present invention addresses these problems by performing the source/drain implant prior to the SAS etch, and by using a spacer formation to protect the stacked gate edge from exposure to the SAS process. Since this spacer formation is already inherent in nearly all CMOS processes as described above with reference to FIGS. 1–4, existing process techniques do not have to be made significantly more complicated to provide the protection from SAS etch related problem. Through the use of this spacer formation, the SAS etch does not affect the doped areas nor does it affect the tunnel oxide region.

Figure 11:
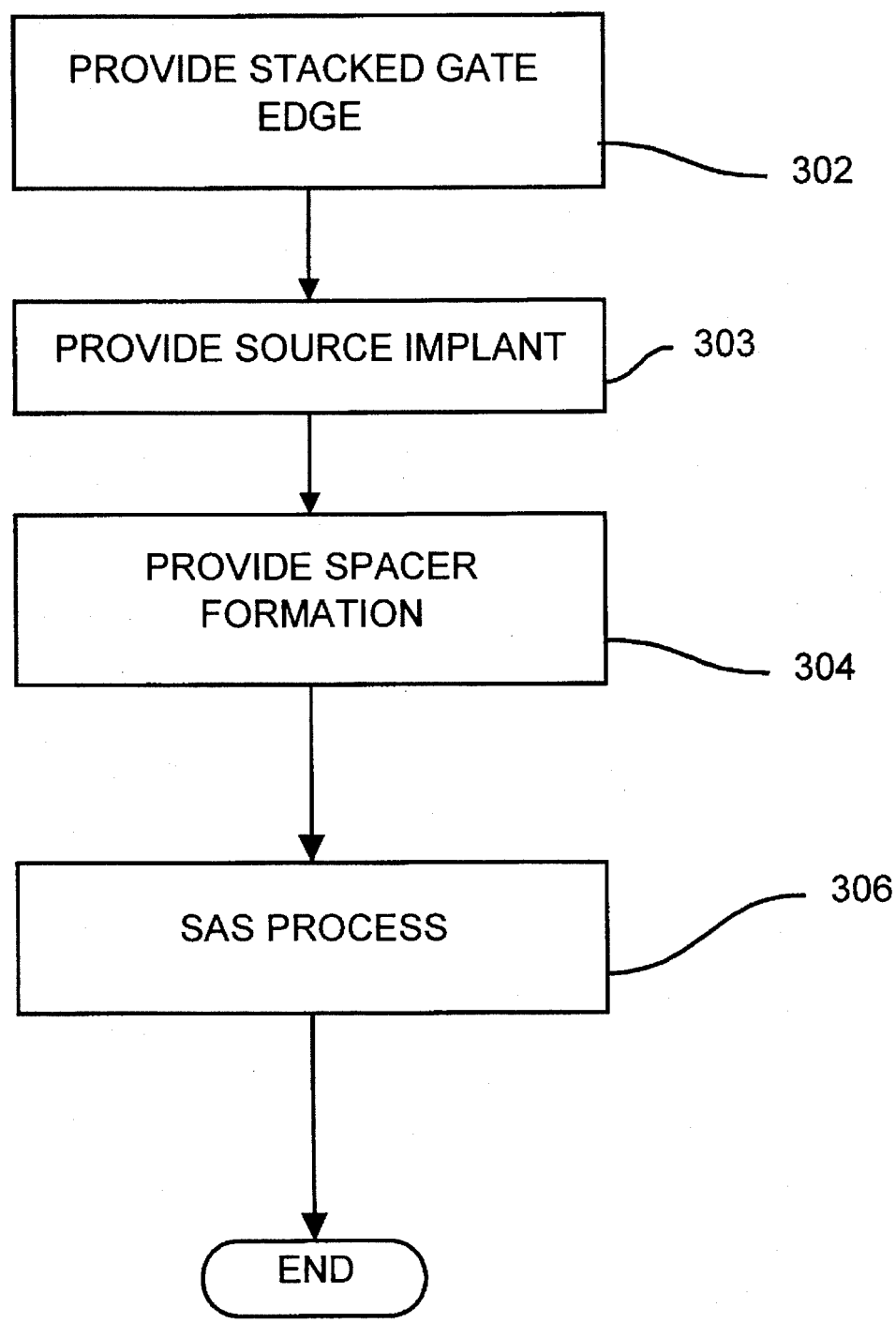
FIG. 11 is a simple flow chart of the process of providing a FLASH cell in accordance with the present invention.
Figure 12A:
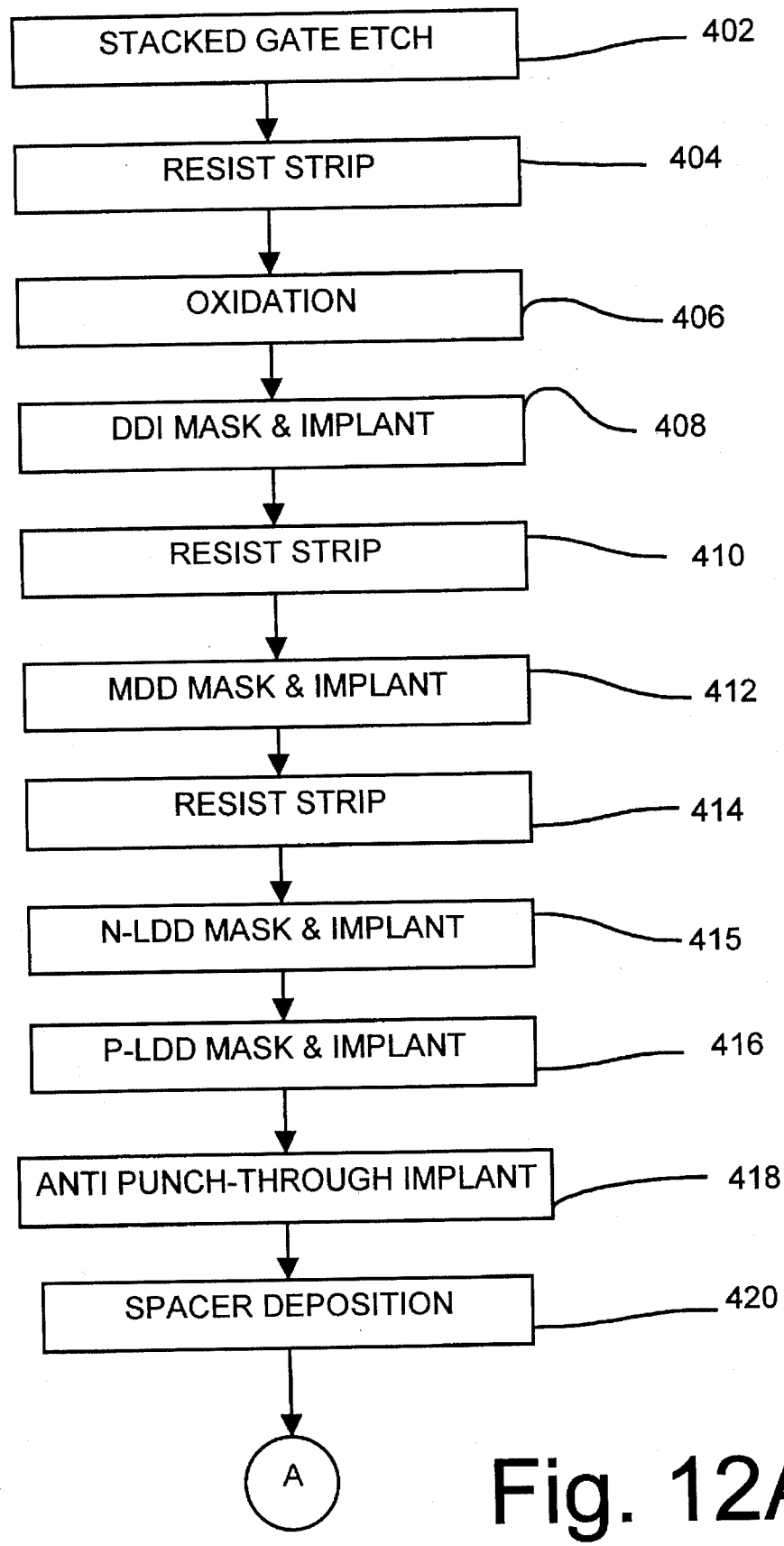
Figure 12B:
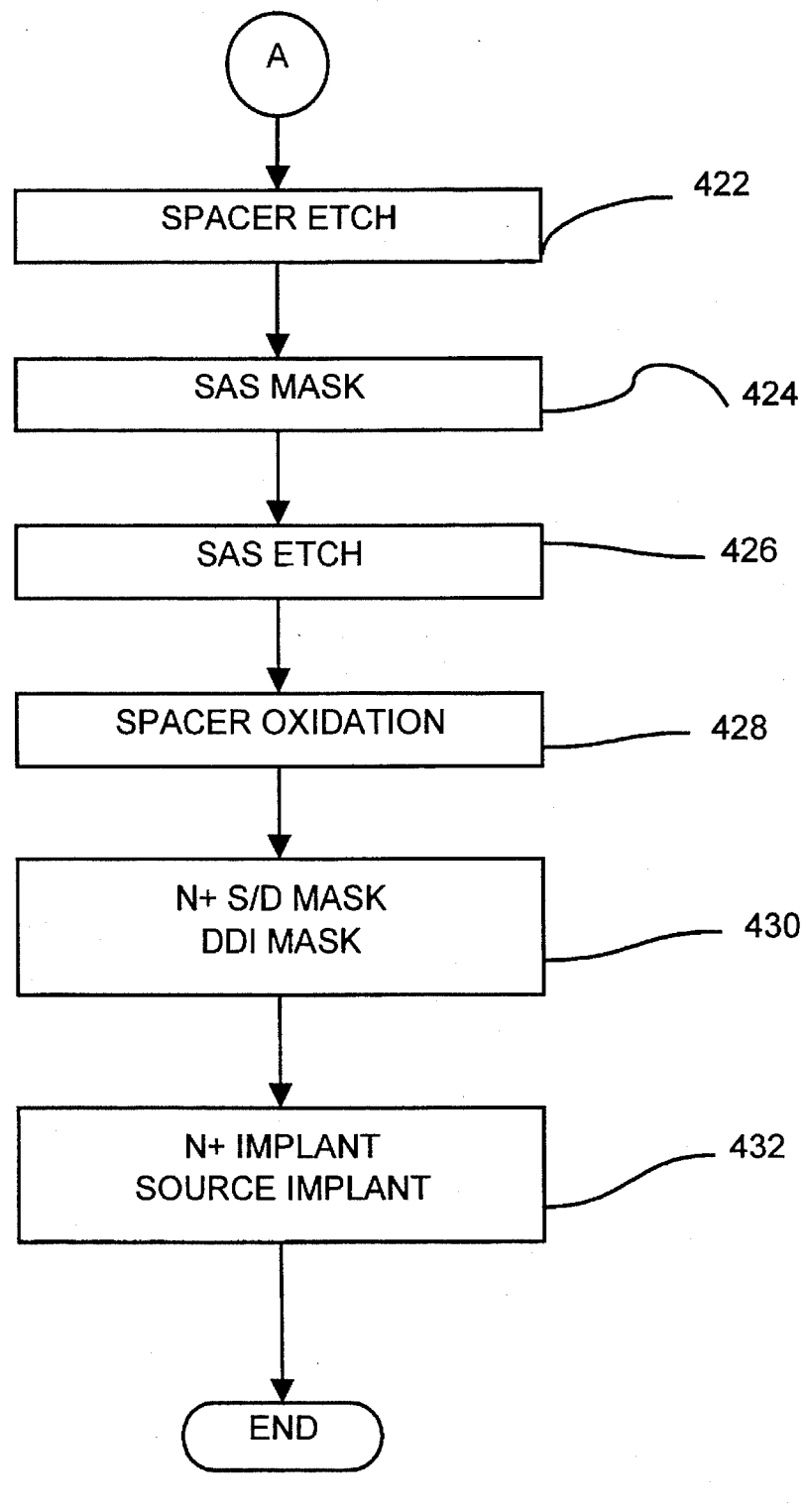

To more specifically describe the features of the present invention, refer now to FIG. 11, which is a simple flow chart showing the process in accordance with the present invention. Accordingly this process comprises providing a stacked gate edge, via step 302. Source implant is performed along with the drain implant, via step 303. The spacer formation is then provided, via step 304. Thereafter, the self-aligned source etch is provided, via step 306. This way any damage that occurs due to SAS etch is placed away from the stacked gate edge, thus tunnel oxide and source doping profiles are both protected.

To describe this process with reference to a preferred embodiment refer now to FIG. 12 which shows a detailed flow chart of the process shown in FIG. 11. Referring now to FIG. 12, what is shown is a flow chart of the method for protecting the tunnel oxide, stacked gate edge and source junction function profile of a device. First, the stacked gate etch takes place, via step 402. Then the resist strip takes place, via step 404. Next a thin oxide or oxidation for implant screen is provided, via step 406.

Thereafter, the double diffused implant (DDI) mask and DDI implant takes place, via step 408 and another resist strip takes place, via step 410. Thereafter, the modified drain diffusion (MDD) mask and implant takes place via step 412 by which the source profile is formed along with the drain profile and another resist strip takes place, via step 413. Thereafter a N-lightly doped drain (LDD) mask and implant and a P-LDD implant mask and implant is provided, via steps 415 and 416 and an antipunch through (AT) implant is provided, via step 418.

Figure 13:
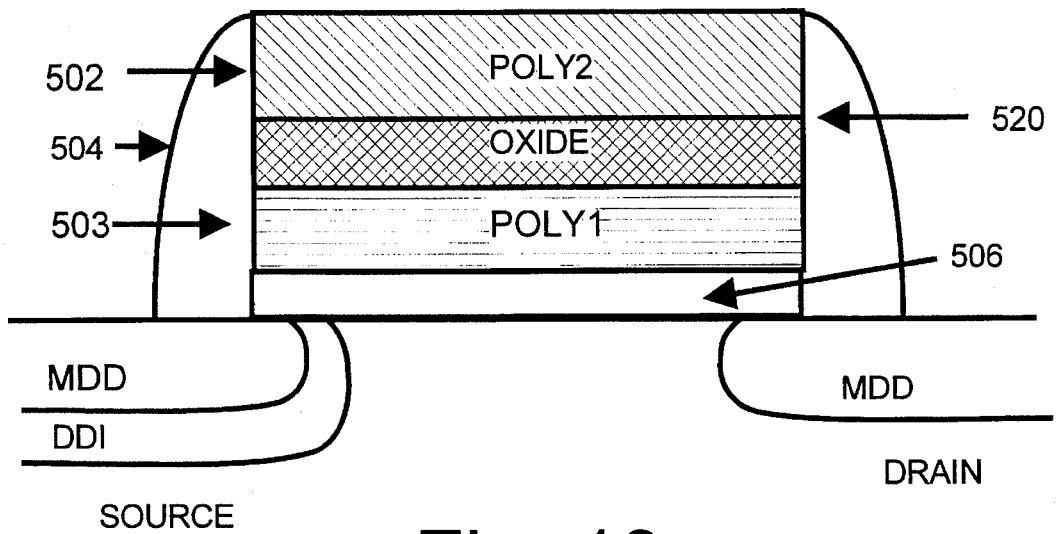
FIG. 13 is a cutaway view of the FLASH cell before the SAS etch in accordance with the process flow of the present invention.

Then the spacer deposition is provided via step 420. Finally, the spacer is etched, via step 422 for spacer formation. This spacer could be comprised of various types of material. At this point, the cross section of the core cell 500 looks like that shown in FIG. 13. Accordingly, the stacked gate edge 502 and the tunnel oxide 506 are protected by the spacer formation 504. Thereafter the process for providing SAS etch can occur. Referring back to FIG. 12, an SAS mask is provided, via step 424. Then the SAS etch can be provided, via step 426. Thereafter the SAS mask is removed and the post-spacer etch oxidation takes place, via step 428. Then the N+ S/D mask and DDI mask (a critical mask) are provided, via step 430. Finally, the N+ source/drain (S/D) implant and a source connection implant are provided via step 432.

Figure 14:
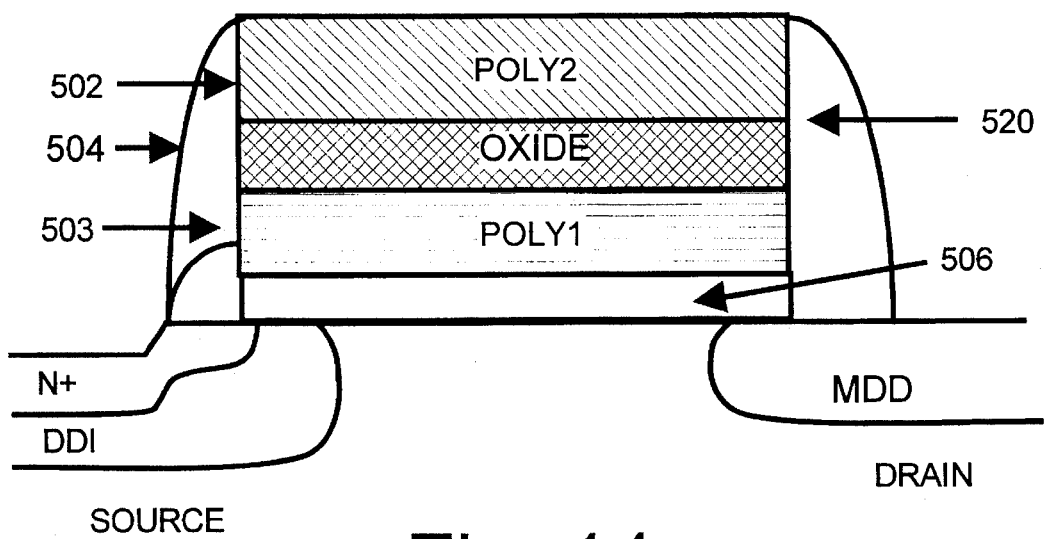
FIG. 14 is a cutaway view of the FLASH cell after the SAS etch.

In the conventional process, since the MDD implant is done after the SAS etch, the $V_{SS}$ line is automatically connected. In one embodiment of this invention, since the MDD implant is done before the SAS etch, an additional implant is needed to connect the field oxide region and active region of the source line. In an alternate embodiment, this additional implant can be obtained without an extra processing step by using the $N^+$ S/D implant, step 432, to connect the source line from the actual source region and field region that is SAS etched for the $V_{SS}$ line connection. The cross section of the resulting cell 500 will look like that shown in FIG. 14. In this cell the tunnel oxide integrity is improved and there is a uniform source region under the source overlap area since the implant is placed before SAS etch and due to the protection by the spacer formation 504. Therefore, the source implant is not provided to a gouged portion of the silicon. Accordingly, a uniform source region is provided under the gate.

Figure 15:
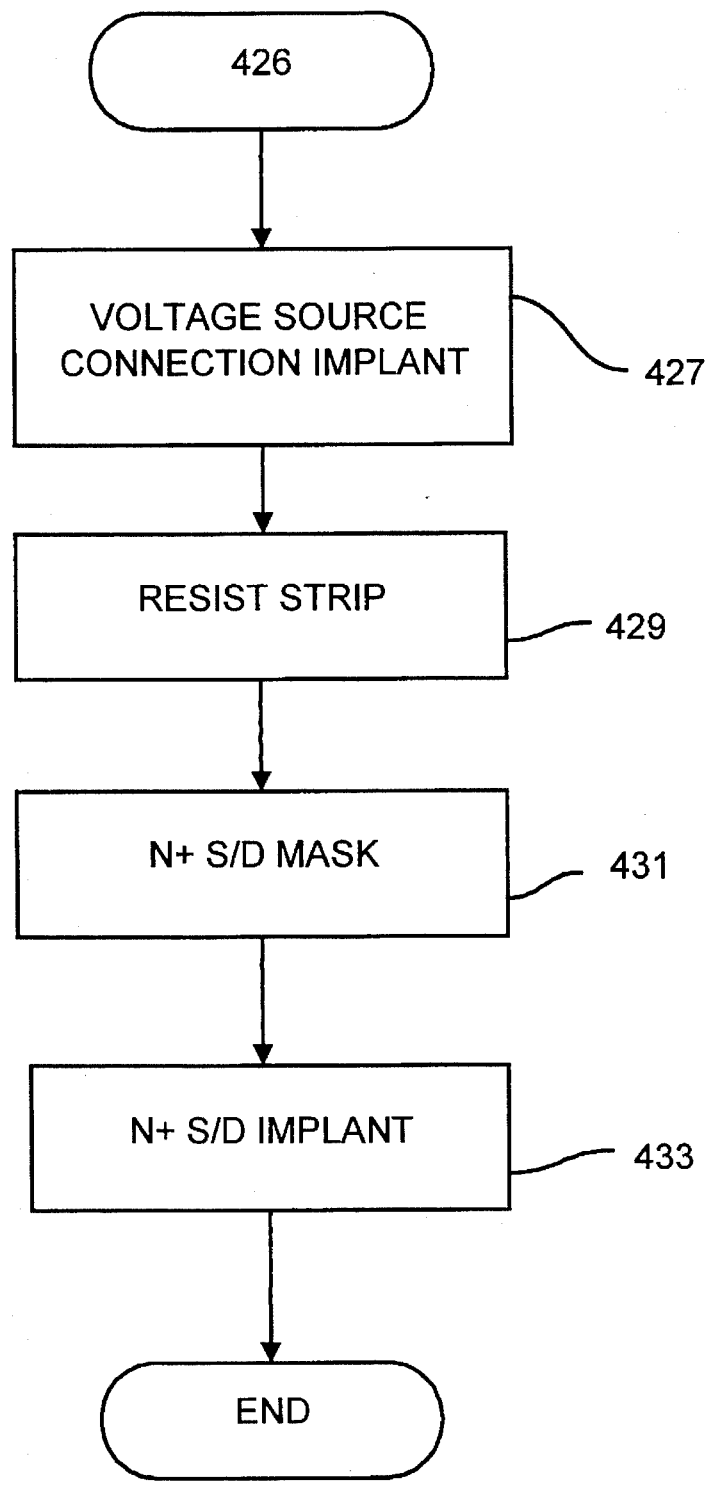
FIG. 15 is a flow diagram of an alternate embodiment of the process shown in FIG. 12.

An alternate embodiment to the method of FIG. 12 is shown in FIG. 15. The alternate method follows FIG. 12 through step 426 and the SAS etch step as shown in FIG. 12B. However, instead of providing spacer oxidation as shown in step 428 of FIG. 12, the process in FIG. 15 continues with step 427 and the source connection implant. After the source connection implant step, a resist strip occurs (step 429). The process then continues with the provision of a N+ S/D mask in step 431, followed by a N+ S/D implant in step 433.

With this alternate embodiment, some of the processing steps are eliminated. More specifically, there is no oxidation deposition step (e.g., step 428 in FIG. 12A). Also, since there is no oxidation step, the mask used for the SAS etch is also used as the mask for the source connection step (step 427 FIG. 15). Thus, the steps of providing a source connection implant mask and then subsequently removing the mask following the implant are also eliminated. Although the elimination of the oxidation step in the alternate embodiment poses a potential contamination risk to the structure during the voltage source connection implant, the benefits of reducing processing time and therefore production cost by eliminating the step outweigh the risk of possible contamination.

Accordingly, in the present invention, the performing of a source/drain implant and providing of the spacer formation prior to the SAS etch improves the tunnel oxide region integrity. In addition, through the use of the processes of the present invention, the stacked gate edge is immune to gouging and source junction profile is improved.

It should be understood that although the present invention has been described in conjunction with a specific type of cell (FLASH EPROM) it should be recognized by one of ordinary skill in the art that many types of cells can be produced utilizing this process. It should also be recognized that many types of materials and processes can be utilized to provide the resist strip, etch, and implants and they would be within the spirit and scope of the present invention.

Although the present invention has been described in accordance with the embodiments shown in the figures one of ordinary skill in the art will recognize there could be variations to those embodiments and those variations would be within the spirit and scope of the present invention. Accordingly, many modifications may be made by one of ordinary skill in the art without departing from the spirit and scope of the present invention, the scope of which is defined solely by the appended claims.

What is claimed is:

1. A method for protecting a stacked gate edge to minimize damage to a tunnel oxide and to maintain source junction uniformity of a semiconductor device comprising the sequential steps of:

(a) providing the stacked gate edge on the semiconductor device;

(b) performing a source implant on the semiconductor device;

(c) providing a spacer on the stacked gate edge;

(d) providing a self aligned source (SAS) etch on the semiconductor device; and (e) providing a source connection implant.

2. The method of claim 1 in which the stacked gate edge providing step (a) further comprises the step of:

(a1) etching the stacked gate edge.

3. The method of claim 2 in which the stacked gate edge providing step (a) further comprises the step of:

(a2) providing a resist strip;

(a3) providing an oxidation layer; and (a4) providing a mask and an implant on the semiconductor device.

4. The method of claim 1 in which the spacer step (c) further comprises the steps of:

(c1) depositing a spacer material; and (c2) etching the spacer material to form the spacer.

5. The method of claim 1 in which the SAS etch providing step (d) further comprises the steps of:

(d1) providing an SAS mask; and (d2) etching the SAS mask.

6. The method of claim 5 in which the source connection implant providing step (e) further comprises the steps of:

(e1) implanting a dopant to connect a source line from a source region to a field region of the semiconductor device.

7. The method of claim 1 in which the source implant performing step (b) comprises:
   (b1) providing a resist mask on the semiconductor device;
   (b2) providing a source implant on the semiconductor device; and
   (b3) providing a resist strip to form a continuous source profile of the semiconductor device to facilitate uniform erasure.

* * * * *